(12) United States Patent
Tsai et al.

(10) Patent No.: US 8,633,091 B2
(45) Date of Patent: Jan. 21, 2014

(54) CHIP PACKAGE AND FABRICATION METHOD THEREOF

(71) Applicant: Xintec Inc., Jhongli (TW)

(72) Inventors: Chia-Lun Tsai, Tainan (TW); Tsang-Yu Liu, Zhubei (TW); Chia-Ming Cheng, New Taipei (TW)

(*) Notice: Subject to any disclaimer, the term of this patent is extended or adjusted under 35 U.S.C. 154(b) by 0 days.

(21) Appl. No.: 13/802,262

(22) Filed: Mar. 13, 2013

(65) Prior Publication Data

US 2013/0196470 A1 Aug. 1, 2013

Related U.S. Application Data

(62) Division of application No. 12/896,277, filed on Oct. 1, 2010, now Pat. No. 8,399,963.

(60) Provisional application No. 61/247,668, filed on Oct. 1, 2009.

(51) Int. Cl.
*H01L 21/30* (2006.01)
*H01L 21/301* (2006.01)

(52) U.S. Cl.
USPC ........... 438/462; 438/458; 438/667; 438/978; 438/113; 257/E21.599

(58) Field of Classification Search
USPC .................. 438/462, 458, 667, 978, 113; 257/E21.599
See application file for complete search history.

(56) References Cited

U.S. PATENT DOCUMENTS

| 5,571,754 | A  | * | 11/1996 | Bertin et al. | 438/109 |
| 6,440,822 | B1 | * | 8/2002  | Hayama et al. | 438/462 |
| 7,569,421 | B2 | * | 8/2009  | Do et al. | 438/113 |
| 8,232,202 | B2 | * | 7/2012  | Chien et al. | 438/667 |
| 8,324,079 | B2 | * | 12/2012 | Takahashi et al. | 438/458 |
| 2003/0227079 | A1 | * | 12/2003 | Chia et al. | 257/723 |
| 2006/0264041 | A1 | * | 11/2006 | Rigg et al. | 438/667 |
| 2009/0184414 | A1 | * | 7/2009  | Park et al. | 257/698 |
| 2009/0267173 | A1 | * | 10/2009 | Takahashi et al. | 257/434 |

* cited by examiner

*Primary Examiner* — Nitin Parekh
(74) *Attorney, Agent, or Firm* — Liu & Liu

(57) ABSTRACT

A chip package includes a substrate having a pad region, a device region, and a remained scribe region located at a periphery of the substrate; a signal and an EMI ground pads disposed on the pad region; a first and a second openings penetrating into the substrate to expose the signal and the EMI ground pads, respectively; a first and a second conducting layers located in the first and the second openings and electrically connecting the signal and the EMI ground pads, respectively, wherein the first conducting layer and the signal pad are separated from a periphery of the remained scribe region, and wherein a portion of the second conducting layer and/or the EMI ground pad extend(s) to a periphery of the remained scribe region; and a third conducting layer surrounding the periphery of the remained scribe region to electrically connect the second conducting layer and/or the EMI ground pad.

14 Claims, 14 Drawing Sheets

CHIP PACKAGE AND FABRICATION METHOD THEREOF

CROSS REFERENCE

This application is a Divisional of U.S. application Ser. No. 12/896,277, filed on Oct. 1, 2010, now U.S. Pat. No. 8,399,963, which claims the benefit of U.S. Provisional Application No. 61/247,668, filed on Oct. 1, 2009, the entirety of which are incorporated by reference herein.

BACKGROUND OF THE INVENTION

1. Field of the Invention

The present invention relates to a chip package, and in particular relates to a chip package having a shield structure for EMI resistance and manufacturing method thereof.

2. Description of the Related Art

As chip packages and signal transmission continue become thinner and lighter, electromagnetic interference (EMI) problems for the chip packages become worst. With the size of chip packages shrinking, forming a satisfactory EMI shield structure is now more difficult. For example, the positions of the EMI ground pads may often be limited or manufacturing costs may be too expensive.

Therefore, a novel chip package and manufacturing method thereof is desired to overcome the problems mentioned above.

BRIEF SUMMARY OF THE INVENTION

An embodiment of the present invention provides a chip package, comprising: a semiconductor substrate having at least a contact pad region, at least a device region, and a remained scribe region located at a periphery of the semiconductor substrate; a signal contact pad structure and an EMI ground pad structure disposed on the contact pad region; a first opening and a second opening penetrating into the semiconductor substrate to expose the signal contact pad structure and the EMI ground pad structure, respectively; a first conducting layer and a second conducting layer located in the first opening and the second opening and electrically connected to the signal contact pad structure and the EMI ground pad structure, respectively, wherein the first conducting layer and the signal contact pad structure are separated from a periphery of the remained scribe region by an interval, and wherein a portion of the second conducting layer and/or a portion of the EMI ground pad structure extend(s) to a periphery of the remained scribe region; and a third conducting layer surrounding the periphery of the remained scribe region to electrically connect to the second conducting layer and/or the EMI ground pad structure.

In addition, an embodiment of the present invention provides a method for forming a chip package, comprising: providing a semiconductor substrate having a plurality of die regions and predetermined scribe regions, wherein each of the die regions comprise at least a contact pad region and at least a device region, and the predetermined scribe regions surround the die regions, wherein the predetermined scribe region comprises an actual scribe region, and a remained scribe region is between the predetermined scribe region and the actual scribe region; forming a signal contact pad structure and an EMI ground pad structure on the contact pad region; forming a first opening and a second opening in the die region to expose the signal contact pad structure and the EMI ground pad structure; forming a first conducting layer and a second conducting layer in the first opening and the second opening to electrically contact with the signal contact pad structure and the EMI ground pad structure, respectively, wherein the first conducting layer and the signal contact pad structure are separated from a periphery of the predetermined scribe region or the remained scribe region by an interval, and the second conducting layer and/or a portion of the EMI pad structure at least extend(s) to an interface between the remained scribe region and the actual scribe region; and dicing the semiconductor substrate along the actual scribe region to separate a plurality of chip packages, wherein the second conducting layer and/or a portion of the EMI ground pad structure extend(s) to a periphery of the remained scribe region.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer include embodiments where the first and second layers are in direct contact and those where one or more layers are interposing the first and second layers.

A CMOS image sensor device package is taken as an example. However, a MEMS chip package or other semiconductor chips may also be suitable for implementation. That is, it should be appreciated that the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power IC.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

Figure 1A:
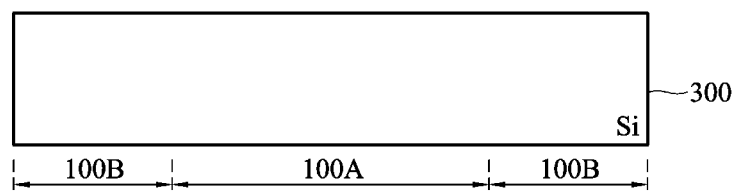
FIGS. 1A-1H are cross-sectional views showing the steps of forming a chip package according to an embodiment of the present invention.

Referring to FIGS. 1A-1H, cross-sectional views showing the steps for forming a chip package according to an embodiment of the invention are shown. As shown in FIG. 1A, a semiconductor substrate 300 is first provided, which is typically a semiconductor wafer (such as a silicon wafer) or a silicon substrate. In addition, a plurality of device regions 100A is defined in the semiconductor substrate which is surrounded by peripheral contact pad regions 100B. The device regions 100A and the peripheral contact pad regions 100B together form a portion of the die regions.

Figure 1B:
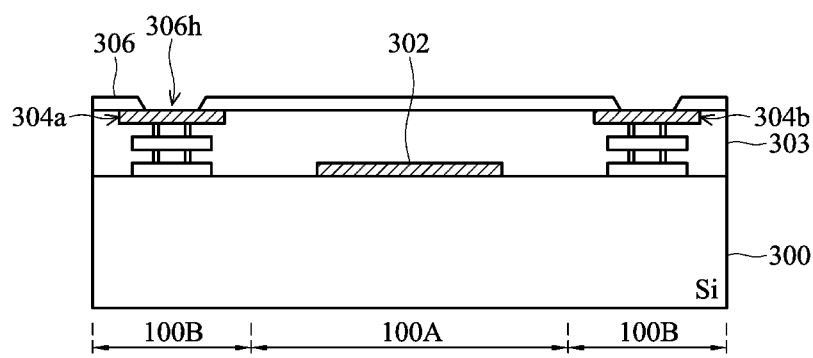

As shown in FIG. 1B, a semiconductor device 302 is then formed in the device region 100A, such as an image sensor or a MEMS device. An interlayer dielectric layer 303 (IMD) covers the semiconductor substrate 300 and the semiconductor device 302, which may be low-k insulating material, such as a porous oxide layer. Then, a plurality of contact pad structures is formed in the interlayer dielectric layer 303 of the peripheral contact pad regions 100B. In this embodiment, the formed contact pad structures comprise a signal contact pad structure 304a and an EMI ground pad structure 304b. The contact pad structures mentioned above may preferably be formed of copper (Cu), aluminum (Al), or other suitable metal material.

In addition, the semiconductor substrate 300 may be covered with a chip passivation layer 306. Meanwhile, in order to electrically connect to the elements in the chip to outside circuits, the chip passivation layer 306 may be defined in advance to form a plurality of openings 306h exposing the contact pad structures.

Figure 1C:
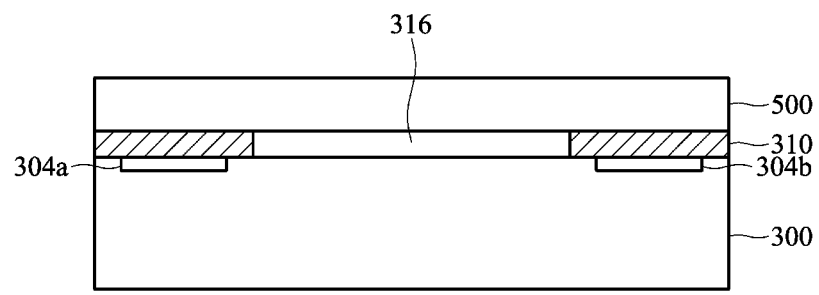

Then, as shown in FIG. 1C, a package layer 500 is provided for bonding with the semiconductor substrate, and only the contact pad structures 304a and 304b are shown in the semiconductor substrate 300 for simplicity. The package layer 500 may be, for example, a transparent substrate such as a glass substrate, another blank silicon wafer, another silicon substrate, or another wafer including integrated circuits. In one embodiment, a spacer layer 310 is used to separate the package layer 500 and the semiconductor substrate 300, wherein a cavity 316 surrounds the spacer layer 310. The spacer layer 310 may be a sealant resin or a photosensitive insulating material, such as epoxy, solder mask, and so on. In addition, the spacer layer 310 may be formed on the semiconductor substrate 300, and then bonded with the package layer 500 using an adhesion layer. Meanwhile, the spacer layer 310 may also be formed on the package layer 500, and then bonded with an opposing semiconductor substrate 300 using an adhesion layer.

Figure 1D:
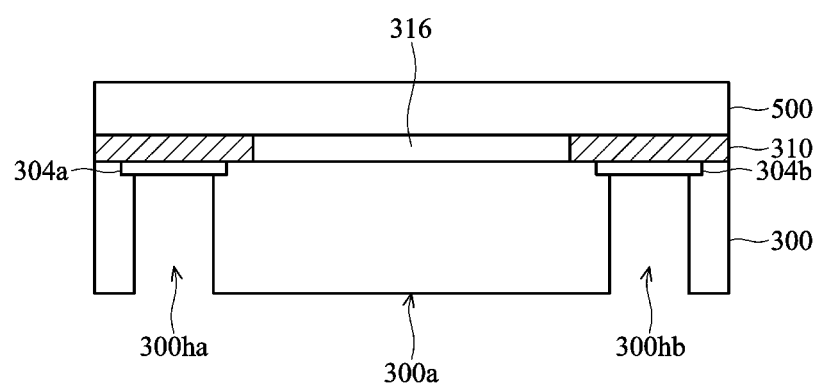

Referring to FIG. 1D, the package layer 500 may be used as a carrier substrate, and an etching process such as an anisotropic etching process may be performed to a back surface 300a of the semiconductor substrate 300 to remove a portion of the semiconductor substrate 300. Openings 300ha and 300hb exposing the signal contact pad structure 304a and the EMI ground pad structure 304b would be formed, respectively.

Figure 1E:
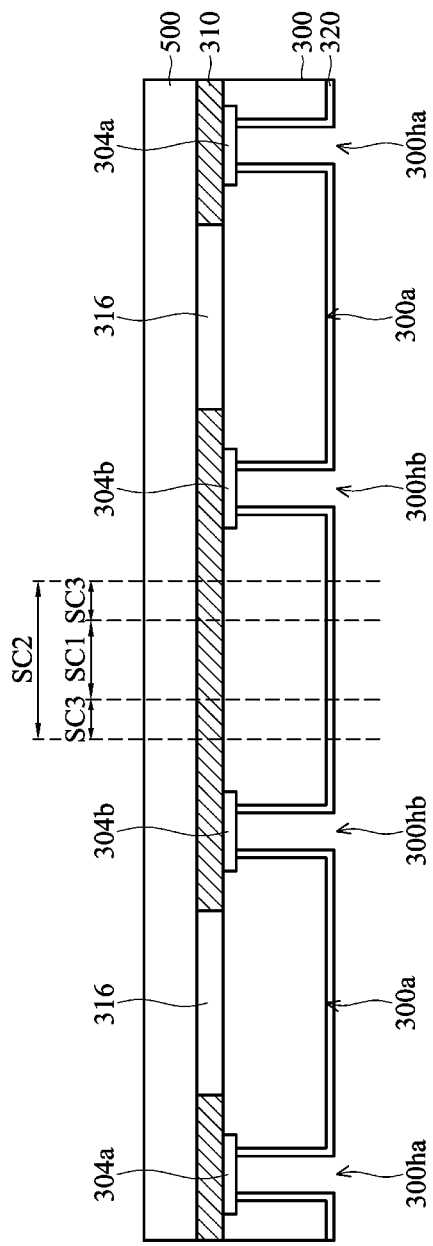

FIG. 1E shows a cross-sectional view of the semiconductor substrate 300 with a larger area, which includes a portion of the die region shown in FIG. 1D and a scribe region nearby and another die region. The scribe region typically includes a predetermined scribe region SC2, and reference number "SC1" represents a region which will be actually cut by a dicing blade. In this embodiment, the spacer layer 310 overlying the EMI ground pad structure 304b traverses the predetermined scribe region and extends overlying the EMI ground pad structure 304b of another peripheral contact pad region. However, the spacer layer 310 overlying the die regions mentioned above may also be two separate discontinuous structures. In addition, when referring to FIG. 1E, one skilled in the art should understand that the size and the position of the scribe region SC1 may be different depending on type, size, and dicing process variations, and FIG. 1E is not limiting. The predetermined scribe region SC2 is usually wider than the actual scribe region SC1 such that an remained scribe region SC3 is left after the actual dicing process to prevent the elements in the semiconductor substrate 300 from being damaged during dicing.

As shown in FIG. 1E, an insulating layer 320 exposing the signal contact pad structure 304a and the EMI ground pad structure 304b is optionally formed in the openings 300ha and 300hb. For example, a silicon oxide layer may be simultaneously formed in the openings 300ha and 300hb by using a thermal oxidation process or a plasma enhanced chemical vapor deposition process. The silicon oxide layer may extend to the back surface 300a of the semiconductor substrate 300. Then, the insulating layer overlying bottom portions of the openings 300ha and 300hb are removed by, for example, an etching process, to expose the signal contact pad structure 304a and the EMI ground pad structure 304b. In this embodiment, the insulating layer 320 in the openings 300ha and 300hb is formed simultaneously. In addition, the insulating layer 320 in the openings 300ha and 300hb may be formed separately depending on requirements. For example, a thick insulating layer may be formed in the opening 300hb exposing the EMI ground pad structure 304b.

Figure 1F:
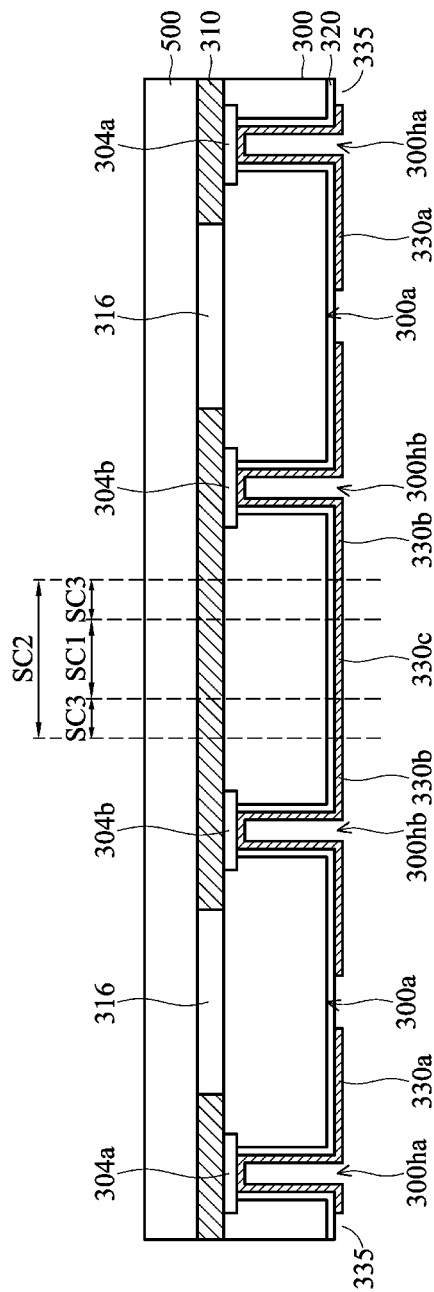

Then, as shown in FIG. 1F, a first conducting layer 330a and a second conducting layer 330b are formed in the opening 300ha and opening 300hb, respectively. In this embodiment, if needed, the first conducting layer may be a redistribution layer. Thus, the redistribution layer may not only be formed to overly a sidewall of the opening 300ha but also be formed to extend and overly the lower surface 300a of the semiconductor substrate 300. However, it should be noted that the first conducting layer 330a does not electrically contact with the second conducting layer 330b. In addition, the first conducting layer 330a is at least separated from a periphery of the actual scribe region SC1 by an interval 335. It is preferable that the first conducting layer 330a is separated from a periphery of the predetermined scribe region SC2 by an interval.

Further, in this embodiment, the second conducting layer 330b may also be used as a redistribution layer. Thus, the redistribution layer may not only be formed to overly a sidewall of the opening 300hb but also be formed to extend and overly the lower surface 300a of the semiconductor substrate 300. In addition, the second conducting layer 330b further extends across the scribe region SC2 and to another die region. As shown in FIG. 1F, the second conducting layer extending into the predetermined scribe region is denoted as reference number "330c" for clarity, which at least extends to an interface between the remained scribe region SC3 and the actual scribe region SC1. For example, in this embodiment, the second conducting layer 330b further links with the second conducting layer 330b in another die region through the conducting layer 330c. However, it should be appreciated that embodiments of the invention are not limited thereto. In another embodiment, the second conducting layer 330b may extend across the scribe region SC2 and reach another die region, but does not electrically contact with the second conducting layer 330b in another die region. Alternatively, in another embodiment, the second conducting layer 330b may also extend merely to the actual scribe region SC1, and not further extend to another nearby die region.

The method for forming the first conducting layer 330a and the second conducting layer 330b may include a physical vapor deposition, chemical vapor deposition, electroplating, or electroless plating process and the material thereof may be a metal material such as copper, aluminum, gold, or combinations thereof. The material of the first conducting layer 330a and the second conducting layer 330b may include a conducting oxide such as indium tin oxide (ITO), indium zinc oxide (IZO), or combinations thereof. In one embodiment, a conducting layer is conformally formed overlying the entire semiconductor substrate 300. Then, the conducting layer is patterned to has the distribution of the conducting layer shown in FIG. 1F. Although the conducting layer is conformally formed overlying the sidewalls of the openings 300ha and 300hb, the conducting layer may also substantially fill the openings 300ha and 300hb completely in another embodiment. In addition, in this embodiment, the first conducting layer 330a and the second conducting layer 330b in the openings 300ha and 300hb are separated from the semiconductor substrate 300 by the same insulating layer 320.

Figure 1G:
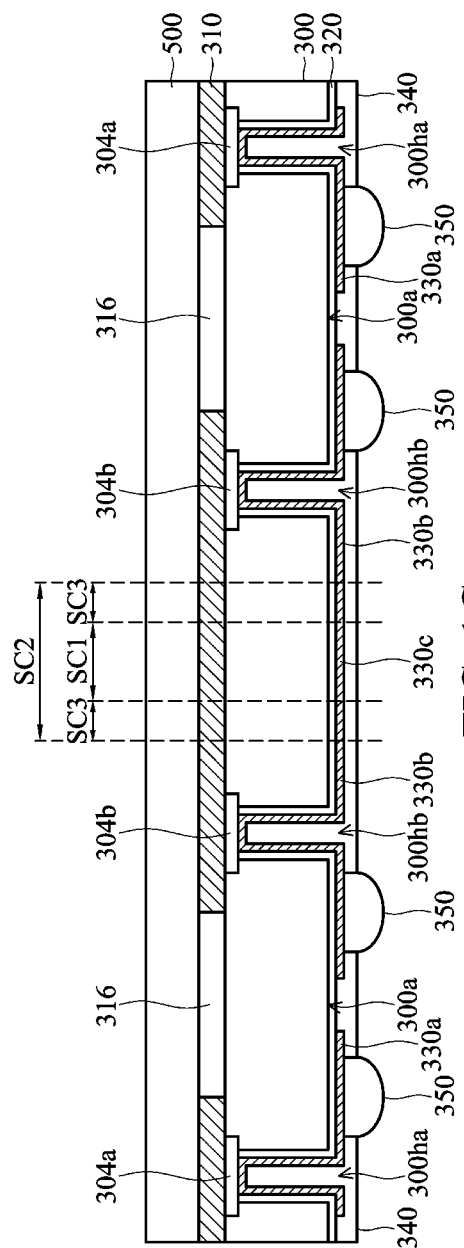

Referring to FIG. 1G, a method for forming a passivation layer 340 is shown. In an embodiment of the invention, the passivation layer 340 may, for example, be a solder mask. A solder mask material may be applied overlying the back surface 300a of the semiconductor substrate to form the passivation layer 340. Then, the passivation layer 340 is patterned to form a plurality of opening of the terminal contacts exposing a portion of the first conducting layer 330a and the second conducting layer 330b. Then, an under bump metallurgy (UBM) (not shown) and a conducting bump 350 are formed at the opening of the terminal contact. For example, the UMP may be formed of a conducting material such as a metal or metal alloy, and may be a nickel, silver, aluminum, copper, or alloy layer, or a doped polysilicon, single crystal silicon, or conducting glass layer. In addition, refractory metal material such as titanium, molybdenum, chromium, or titanium-tungsten layer may be used alone or combined with other metal layers. In a specific embodiment, a nickel/gold layer may be partially or entirely formed overlying a surface of the metal layer. Wherein, the conducting bumps 350 may be electrically connected to the signal contact pad structure 304a and the EMI ground pad structure 304b through the first conducting layer 330a and the second conducting layer 330b, respectively. In an embodiment of the invention, the conducting bump 350 connecting the signal contact pad structure 304a is used to transmit I/O signals of elements (not shown in FIG. 1G and reference may be made to the devices 302 shown in FIG. 1B). The conducting bump 350 connecting the EMI ground pad structure 304b is used as a ground.

Figure 1H:
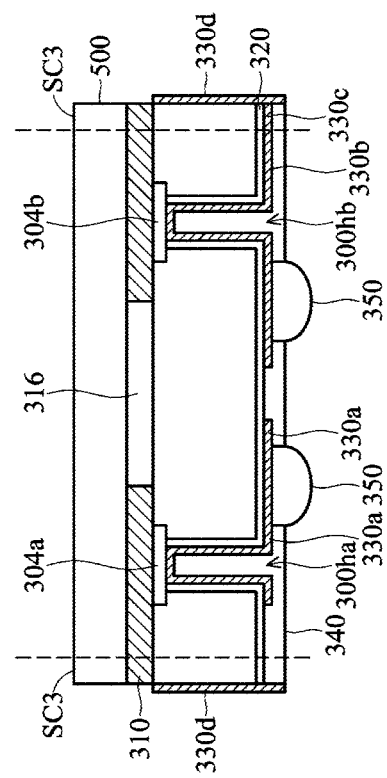

Then, the semiconductor substrate 300 is diced along the scribe region SC1 (i.e., scribe line) in the peripheral contact pad regions to form a plurality of separate chip packages. FIG. 1H shows a cross-sectional view of one of the chip packages. After being diced, both sides of the chip package include the remained scribe region SC3 between the predetermined scribe region SC2 and the actual scribe region SC1.

As shown in FIG. 1H, in this embodiment, after a plurality of separate chip packages are formed, a third conducting layer 330d surrounding a periphery of the remained scribe region SC3 may be optionally formed. Because the first conducting layer 330a and the signal contact pad structure 304a are separated from the periphery of the actual scribe region SC1 or the remained scribe region SC3 by an interval, the formed third conducting layer 330d does not electrically contact with the first conducting layer 330a and the signal contact pad structure 304a to affect signal transmission.

In addition, because the conducting layer 330c traverses across the scribe region SC1 or further extends to a nearby die region, after the chip packages are separated from each other by the dicing process, a portion of the conducting layer 330c is exposed on a surface of the periphery of the remained scribe region SC3. Thus, after the third conducting layer 330d is formed, the third conducting layer 330d may electrically connect to the EMI ground pad structure 304b through the exposed conducting layer 330c and the second conducting layer 330b. The third conducting layer 330d surrounding the chip package provides electromagnetic interference shielding effects.

In one embodiment, the third conducting layer 330d may be applied to completely overly the periphery of the chip package. The third conducting layer 330d may be formed by any conducting layer forming process and/or patterning process. For example, the third conducting layer 330d may be formed overlying the periphery (i.e., the periphery of the remained scribe region SC3) of the chip package by an electroplating process. Alternatively, in another embodiment, the conducting bump 350 and the opening of the terminal contact in the passivation layer 340 may not be formed in advance. The processes relating to the conducting bump 350 may be performed after the third conducting layer 330d is formed.

Figure 2A:
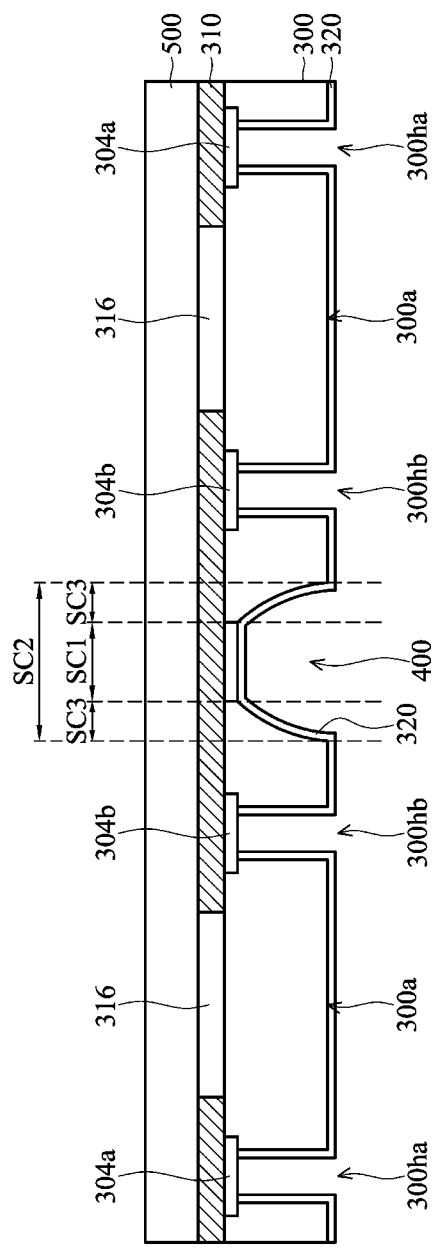
FIGS. 2A-2C are cross-sectional views showing the steps of forming a chip package according to an embodiment of the present invention.
Figure 2B:
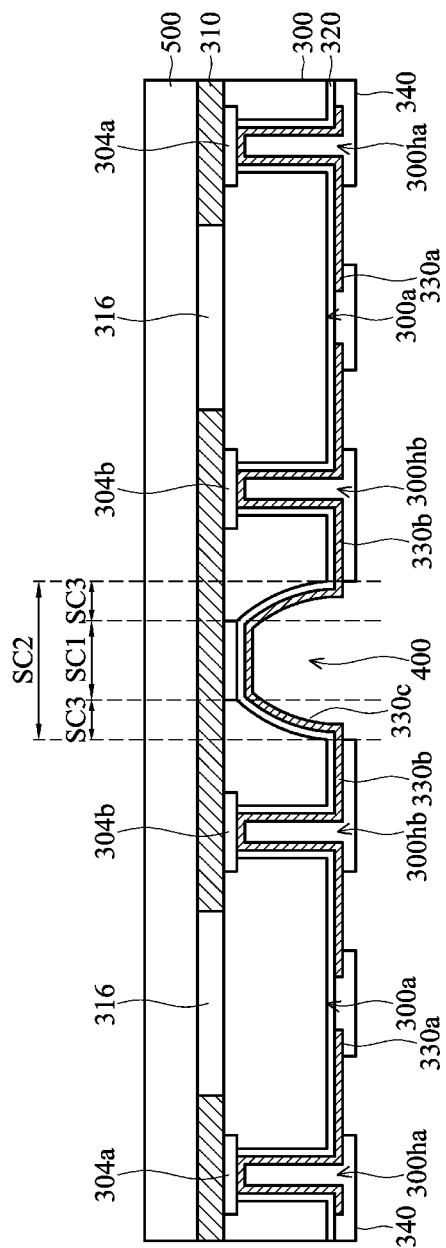
Figure 2C:
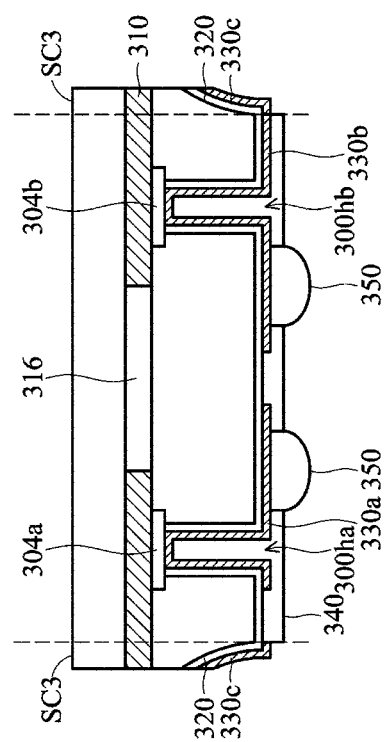

FIGS. 2A-2C are cross-sectional views showing the steps for forming a chip package according to another embodiment of the present invention, wherein same or similar reference numbers are used to designate same or similar elements. In addition, materials or forming methods of the same or similar elements which are the same as or similar to the embodiment shown in FIG. 1 are not illustrated again.

As shown in FIG. 2A, this embodiment is similar to the structure shown in FIG. 1E. The main difference is that the dicing process of the chip package of the embodiment shown in FIG. 2 is performed stepwise. As shown in FIG. 2A, before the insulating layer 320 is formed, a recess 400 is formed in the scribe region SC2 of the semiconductor substrate 300. For example, a dicing blade may be used to cut a portion of the scribe region SC2 from the back surface 300a of the semiconductor substrate 300 to form a cavity 400 with an inclined outline. In another embodiment, the recess may extend into the spacer layer 310 to a predetermined depth. That is, the surface layer of the spacer layer 310 may serve as a barrier layer of the dicing blade. In addition, the deeper the cut of the dicing blade, the nearer the subsequently formed conducting layer 330c is to the spacer layer. Thus, the conducting layer 330c may completely cover the sidewall of the die. Then, the insulating layer 320 may be formed in the first opening 330ha, the second opening 300hb, and the recess 400 simultaneously. The insulating layer 320 is patterned to expose the signal contact pad structure 304a and the EMI ground pad structure 304b as shown in FIG. 2A. The periphery of the remained scribe region SC3 is surrounded by the insulating layer 320.

Then, as shown in FIG. 2B, similar to the embodiment shown in FIG. 1, the first conducting layer 330a, the second conducting layer 330b, and the conducting layer 330c, extending across the scribe region and to the nearby die region, are respectively formed in the first opening 330ha, the second opening 330hb, and the recess 400. In this embodiment, the conducting layer 330c is conformally formed on the recess 400 and has an inclined outline. The conducting layer 330c electrically contacts with the second conducting layers 330b at the two adjacent die regions, respectively. However, as mentioned above, the conducting layer 330c at least needs to be extended to the interface between the remained scribe region SC3 and the actual scribe region SC1. It is not necessary that the conducting layer 330c links with the conducting layer 330c in another die region. Then, a patterned passivation layer 340 may be formed to protect the chip package and define opening of the terminal contacts.

As shown in FIG. 2C, the conducting bumps 350 are formed in the previously defined opening of the terminal contacts. The semiconductor substrate 300 is diced along the scribe line (i.e., the scribe region SC1) to form a plurality of separate chip packages. In this embodiment, the conducting layer 330c, extended to overly the inclined outline of the remained scribe region SC3, surrounds the periphery of the remained scribe region SC3, which may be used as the third conducting layer to provide an EMI shield. In this embodiment, the third conducting layer (i.e., the conducting layer 330c) and the second conducting layer 330b are formed during the same process without the need for additional processes. The third conducting layer (i.e., the conducting layer 330c) surrounds the insulating layer 320 overlying the periphery of the remained scribe region SC3.

Figure 3A:
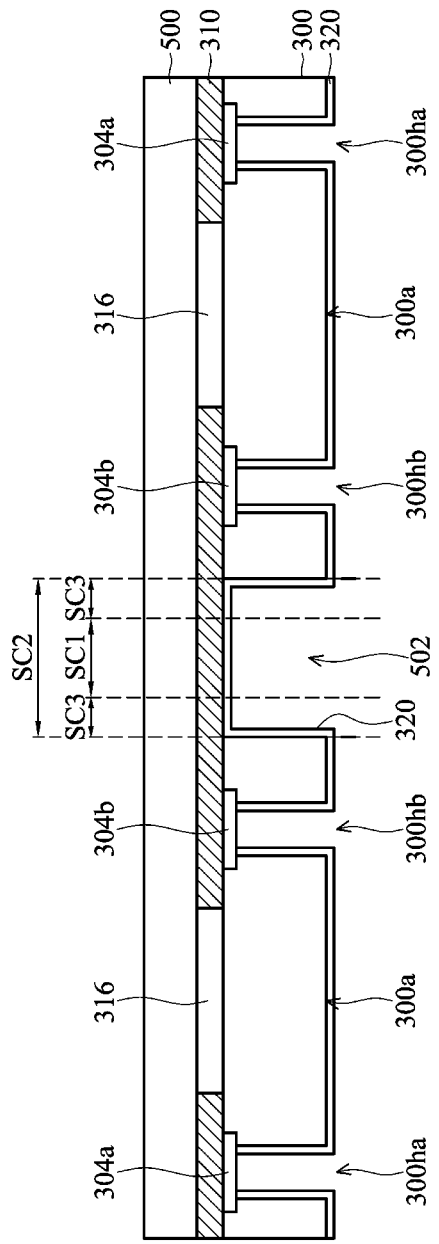
FIGS. 3A-3C are cross-sectional views showing the steps of forming a chip package according to an embodiment of the present invention.
Figure 3B:
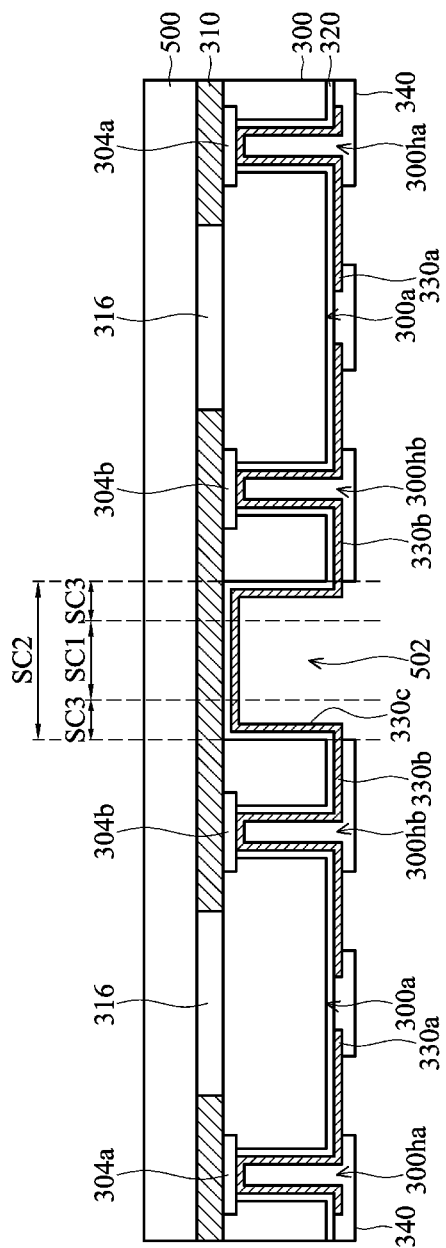
Figure 3C:
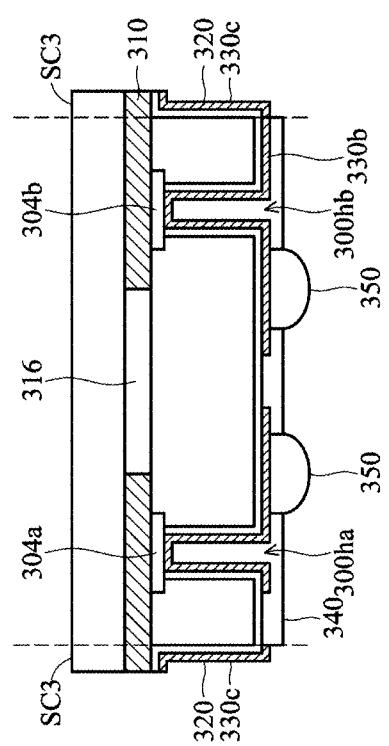

FIGS. 3A-3C are cross-sectional views showing the steps for forming a chip package according to another embodiment of the present invention, wherein same or similar reference numbers are used to designate same or similar elements. In addition, materials or forming methods of the same or similar elements which are the same as or similar to the embodiment shown in FIG. 2 are not illustrated again.

The structure shown in FIG. 3A is similar to that shown in FIG. 2A. The main difference is that the recess 400 with an inclined outline is not formed in this embodiment. A recess 502 having a substantially vertical outline is formed instead. For example, a portion of the semiconductor substrate 300 may be removed from the back surface 300a of the semiconductor substrate 300 by a dry etching process. Thus, forming a recess 502 having a vertical outline. In one embodiment, the recess 502, the first opening 300ha, and the second opening 300hb may be simultaneously formed during the same etching process. Alternatively, in another embodiment, the recess 502, the first opening 300ha, and the second opening 300hb may be formed separately depending on different conditions. Then, the insulating layer 320 may be simultaneously formed in the first opening 300ha, the second opening 300hb, and the recess 502. The insulating layer 320 is patterned to expose the signal contact pad structure 304a and the EMI ground pad structure 304b as shown in FIG. 3A.

Then, as shown in FIG. 3B, similar to the embodiment shown in FIG. 2, the first conducting layer 330a, the second conducting layer 330b, and the conducting layer 330c, extending across the scribe region and to the nearby die region, are respectively formed in the first opening 330ha, the second opening 330hb, and the recess 502. In this embodiment, the conducting layer 330c is conformally formed on the recess 502 and has a vertical outline. The conducting layer 330c electrically contacts with the second conducting layers 330b in two adjacent die regions, respectively. However, in another embodiment, the conducting layer 330c at least needs to be extended to the interface between the remained scribe region SC3 and the actual scribe region SC1. For example, the conducting layer 330c merely extends to the actual scribe region SC1. Then, a patterned passivation layer 340 may be formed to protect the chip package and define the opening of the terminal contacts.

As shown in FIG. 3C, the conducting bumps 350 are formed in the previously defined opening of the terminal contacts. The semiconductor substrate 300 is diced along the scribe line (i.e., the scribe region SC1) to form a plurality of separate chip packages. In this embodiment, the remained scribe region SC3 has an L-shaped outline. In addition, the conducting layer 330c, extending to overly the L-shaped outline of the remained scribe region SC3, surrounds the periphery of the remained scribe region SC3, which may be used as the third conducting layer to provide a shield to the EMI. In this embodiment, the third conducting layer (i.e., the conducting layer 330c) and the second conducting layer 330b are formed during the same process without the need for additional processes.

Figure 4A:
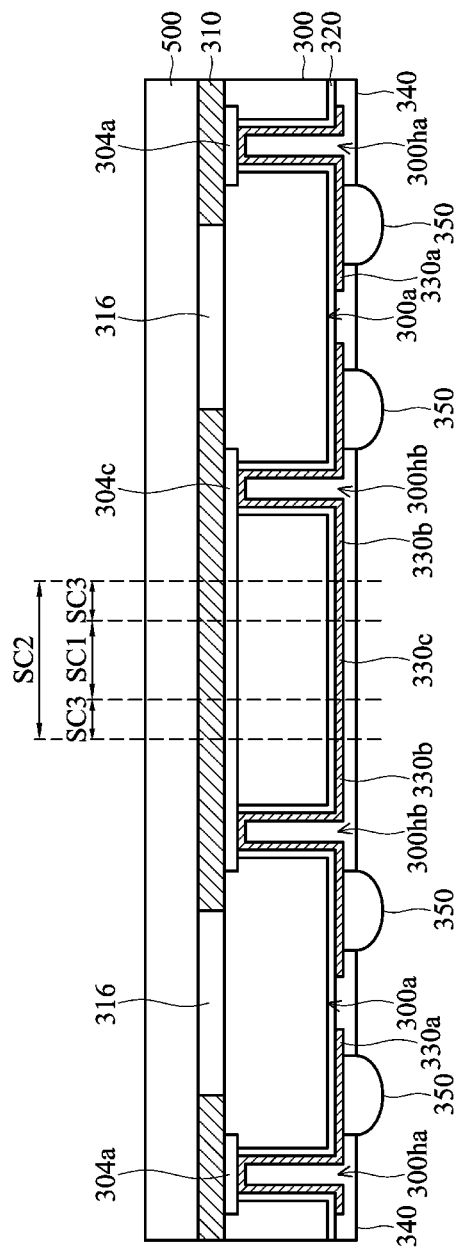
FIGS. 4A-4B are cross-sectional views showing the steps of forming a chip package according to an embodiment of the present invention.
Figure 4B:
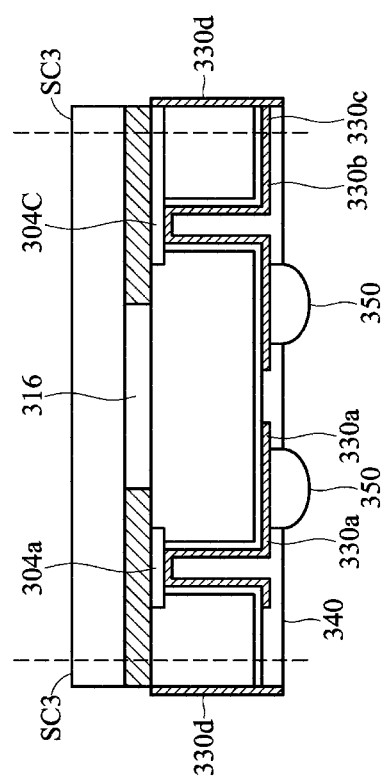

FIGS. 4A-4B are cross-sectional views showing the steps for forming a chip package according to another embodiment of the present invention, wherein same or similar reference numbers are used to designate same or similar elements. In addition, materials or forming methods of some same or similar elements are same as or similar to the embodiment shown in FIG. 1 and thus are not illustrated repeatedly.

The structure shown in FIG. 4A is similar to that shown in FIG. 1G. The main difference is that the EMI ground pad structure 304c of the embodiment shown in FIG. 4A at least extends to the interface between the remained scribe region SC3 and the actual scribe region SC1. For example, the EMI ground pad structure 304c extends across the predetermined scribe region SC1 and reaches the peripheral contact pad region in the nearby die region. However, in another embodiment, the EMI ground pad structure 304c may extend to the actual scribe region SC1.

Then, as shown in FIG. 4B, the semiconductor substrate 300 is diced along the scribe line (i.e., the scribe region SC1) to form a plurality of separate chip packages. Because the EMI ground pad structure 304c extends across the scribe region, the EMI ground pad structure 304c is exposed on a surface of the periphery of the remained scribe region SC3 after the dicing process.

Then, the third conducting layer 330d surrounding the periphery of the remained scribe region SC3 is formed. Because the first conducting layer 330a and the signal contact pad structure 304a are separated from the periphery of the remained scribe region SC3 by an interval, the formed third conducting layer 330d does not electrically contact with the first conducting layer 330a and the signal contact pad structure 304a to affect signal transmissions. In addition, after the third conducting layer 330d is formed, the third conducting layer 330d may electrically contact with the exposed conducting layer 330c and the EMI ground pad structure 304c. The third conducting layer 330d surrounding the chip package provides EMI shielding. In this embodiment, although the third conducting layer 330d electrically contacts with both the conducting layer 330c and the EMI ground pad structure 304c, the third conducting layer 330d may also only contact with the exposed EMI ground pad structure 304c.

In addition, in the embodiments mentioned above, the EMI ground pad structure may include a plurality of metal layers (such as that shown in FIG. 1B) and directly contact with the second conducting layer through one of the metal layers. For example, the EMI ground pad structure may electrically and/ or directly contact with the second conducting layer through the bottom one of the metal layers. In addition, in an embodiment similar to that shown in FIG. 4, the EMI ground pad structure may also include a plurality of metal layers and electrically and/or directly contact with the third conducting layer through one of the metal layers extending to the periphery of the remained scribe region SC3.

Through the methods disclosed in the embodiments of the present invention, the conducting bumps electrically connected to the EMI ground pad structure may be placed on any position of the bottom of the chip package, which may increase design freedom for the chip package. In addition, in some of the embodiments, the conducting layer or conducting pattern used for EMI shielding and the conducting layer or conducting pattern used for signal transmission may be simultaneously defined, which improves product throughput and reduces manufacturing time and costs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a chip package, comprising:
providing a semiconductor substrate having a plurality of die regions and predetermined scribe regions, wherein each of the die regions comprise at least a contact pad region and at least a device region, and the predetermined scribe regions surround the die regions, wherein each of predetermined scribe region comprises an actual scribe region, and a remained scribe region is between the predetermined scribe region and the actual scribe region;
forming a signal contact pad structure and an EMI ground pad structure on the contact pad region;
forming a first opening and a second opening through the substrate in the die region to expose the signal contact pad structure and the EMI ground pad structure;
forming a first conducting layer and a second conducting layer in the first opening and the second opening to electrically contact with the signal contact pad structure and the EMI ground pad structure, respectively, wherein the first conducting layer and the signal contact pad structure are separated from a periphery of the predetermined scribe region or the remained scribe region by an interval, and the second conducting layer and/or a portion of the EMI pad structure at least extend(s) to an interface between the remained scribe region and the actual scribe region; and
dicing the semiconductor substrate along the actual scribe region to separate a plurality of chip packages, wherein the second conducting layer and/or a portion of the EMI ground pad structure extend(s) to a periphery of the remained scribe region.

2. The method for forming a chip package as claimed in claim 1, further comprising forming a third conducting layer to surround the periphery of the remained scribe region and electrically connect to the second conducting layer and/or the EMI ground pad structure.

3. The method for forming a chip package as claimed in claim 1, further comprising forming an insulating layer in the first opening and the second opening to separate the first conducting layer and the second conducting layer.

4. The method for forming a chip package as claimed in claim 3, further comprising forming a recess in the predetermined scribe region.

5. The method for forming a chip package as claimed in claim 4, wherein the insulating layer is simultaneously formed in the first opening, the second opening, and the recess.

6. The method for forming a chip package as claimed in claim 5, wherein the recess is formed by cutting the predetermined scribe region by a dicing blade to form an inclined outline.

7. The method for forming a chip package as claimed in claim 5, wherein the recess is formed by a dry etching process to form a vertical outline.

8. The method for forming a chip package as claimed in claim 5, further comprising dicing the semiconductor substrate along the predetermined scribe region and the recess to separate a plurality of chip packages and leave the remained scribe region around a periphery of each of the chip packages, wherein the remained scribe region is surrounded by the insulating layer.

9. The method for forming a chip package as claimed in claim 8, further comprising forming a third conducting layer to surround the insulating layer around the periphery of the remained scribe region and electrically connect to the second conducting layer and/or the EMI ground pad structure.

10. The method for forming a chip package as claimed in claim 4, wherein the semiconductor substrate comprises a first surface and an opposite second surface, the contact pad regions are located on the first surface, and the first opening, the second opening, and the recess are formed from the second surface.

11. The method for forming a chip package as claimed in claim 1, further comprising a package layer covering the semiconductor substrate.

12. The method for forming a chip package as claimed in claim 11, further comprising a spacer layer disposed between the package layer and the semiconductor substrate.

13. The method for forming a chip package as claimed in claim 12, further comprising forming a cavity between the package layer and the semiconductor substrate, wherein the cavity is surrounded by the spacer layer.

14. The method for forming a chip package as claimed in claim 11, wherein the package layer comprises a silicon wafer and a transparent substrate.

* * * * *